United States Patent [19]
Geis et al.

[11] Patent Number: 5,122,223
[45] Date of Patent: Jun. 16, 1992

[54] GRAPHOEPITAXY USING ENERGY BEAMS

[75] Inventors: Michael W. Geis, Acton; Dale C. Flanders, Lexington; Henry I. Smith, Sudbury, all of Mass.

[73] Assignee: Massachusetts Institute of Technology, Cambridge, Mass.

[21] Appl. No.: 680,238

[22] Filed: Dec. 10, 1984

Related U.S. Application Data

[63] Continuation of Ser. No. 325,727, Nov. 30, 1981, abandoned, which is a continuation of Ser. No. 43,541, May 29, 1979, abandoned.

[51] Int. Cl.⁵ .................. C30B 13/32; C30B 29/06; C30B 33/00; C30B 19/12
[52] U.S. Cl. .................. 156/603; 156/612; 156/620.71; 156/620.72; 156/DIG. 64; 156/DIG. 73;DIG. 80; 156/DIG. 88; 148/DIG. 3; 148/DIG. 90; 148/DIG. 131; 437/977
[58] Field of Search .............. 156/612, 624, DIG. 64, 156/DIG. 73, DIG. 80, DIG. 88, DIG. 102, 603, 620.71, 620.72; 148/1.5, DIG. 3, DIG. 90 DIG. 131; 427/86; 437/977

[56] References Cited

U.S. PATENT DOCUMENTS

| | | | |
|---|---|---|---|
| 3,341,361 | 9/1967 | Gorski | 156/DIG. 88 |
| 3,549,432 | 12/1970 | Sivertsen | 156/DIG. 80 |
| 3,585,088 | 6/1971 | Schwuttke et al. | 156/DIG. 80 |
| 3,698,944 | 10/1972 | Dyer | 156/612 |
| 4,059,461 | 11/1977 | Fan et al. | 148/1.5 |
| 4,099,305 | 7/1978 | Cho et al. | 29/579 |
| 4,174,422 | 11/1970 | Mathews | 428/621 |
| 4,333,792 | 6/1982 | Smith | 156/612 |

FOREIGN PATENT DOCUMENTS 2438588 2/1975 Fed. Rep. of Germany ...... 156/612

OTHER PUBLICATIONS

Growth of Crystals, vol. 10, ed. Sheftal Consultants Bureau N.Y.

*Primary Examiner*—Gary P. Straub
*Attorney, Agent, or Firm*—Fish & Richardson

[57] ABSTRACT

Improvements to graphoepitaxy include use of irradiation by electrons, ions or electromagnetic or acoustic radiation to induce or enhance the influence of artificial defects on crystallographic orientation; use of single defects; and use of a relief structure that includes facets at 70.5 and/or 109.5 degrees.

2 Claims, 2 Drawing Sheets

FIG. 1
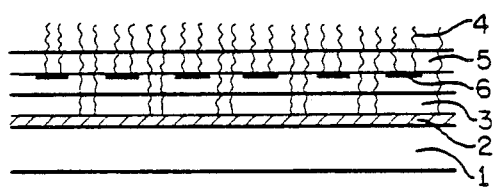
FIG. 2
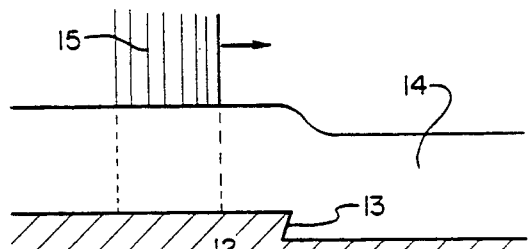
FIG. 8
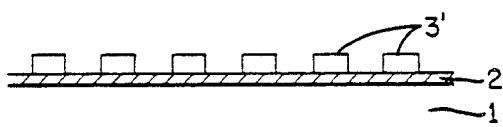
FIG. 3
FIG. 4
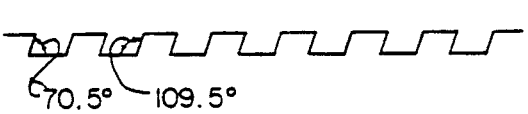
FIG. 9
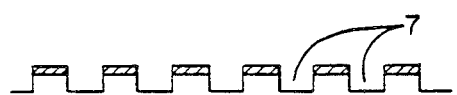
FIG. 5
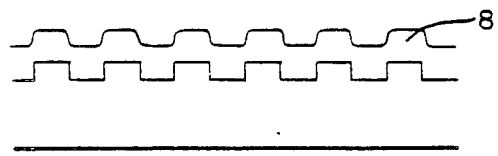
FIG. 6

GRAPHOEPITAXY USING ENERGY BEAMS

The Government has rights in this invention pursuant to Contract Number AF19(628)-76-C-0002 awarded by the U.S. Department of the Air Force.

This application is a continuation of abandoned application Ser. No. 06,325,727 filed Nov. 3, 1981 which was a continuation of abandoned application Ser. No. 043,541 filed May 29, 1979.

BACKGROUND OF THE INVENTION

This invention is an improvement on an earlier invention disclosed in abandoned application Ser. No. 756,358 of Henry I. Smith for Enhancing Epitaxy and Preferred Orientation, and relates in general to improving the crystallographic quality of solid films grown on the surfaces of solid substrates, and more particularly to improved means for obtaining epitaxial or preferred orientation films on solid substrates, both crystalline and amorphous.

Much of modern technology makes use of thin solid films on the surfaces of solid substrates. Epitaxial and preferred orientation films are particularly important, notably in microelectronic devices, thin film optical devices and solar cells. Thus, improved methods of preparing epitaxial and preferred orientation films are of great importance.

The principle involved in the earlier invention, referenced above, was to use a plurality of artificial defects, formed at predetermined locations at the surface of a solid substrate, to determine, control or influence, by means of the geometric arrangement of the adjacent defects, the crystallographic orientation of a film deposited at said surface. The said artificial defects were either (1) artificial point defects or (2) artificial surface relief structure. The method disclosed in said earlier patent has been named "graphoepitaxy" (see "Crystallographic Orientation of Silicon on an Amorphous Substrate Using an Artificial Surface Relief Grating and Laser Crystallization", by M. W. Geis, D. G. Flanders and H. I. Smith, to be published in Applied Physics Letters Jul. 1, 1979). The name is derived from the Greek ("grapho" meaning to write or incise) and was chosen to convey the principle of using an artificially created surface pattern to induce epitaxy. The present invention concerns (1) a particular implementation of graphoepitaxy in which the influence of artificial defects on the crystallographic orientation of a film is induced or enhanced by irradiating the film with the electromagnetic or acoustic radiation or energetic particles, including electrons; (2) a method whereby crystallographic orientation is determined, controlled or influenced by the geometric arrangement of a single defect (that is, its position, orientation and geometric form); and (3) a particular implmentation of graphoepitaxy in which the relief structure includes facets that intersect at approximately 70.5° and 109.5°.

SUMMARY OF THE INVENTION

One or more artificial surface-relief or artificial point defects are intentionally created at predetermined locations at a solid surface and thereafter material is deposited to form a film over the solid surface. During or following the deposition of said film, the surface and/or the material deposited thereon is irradiated with electromagnetic or acoustic wave or energetic particles, thereby adding energy to the film and inducing or enhancing the influence that the artificial surface relief steps or point defects exert in orienting a layer in said film.

The earlier referenced patent application disclosed that the geometric arrangement of adjacent artificials defects (that is their shape, form and relative position in terms of bearing and distance) may be advantageously used to determined, control or influence the crystallographic orientation of a layer. The present invention is an improvement on this principle benefiting from the discovery that the position, orientation and geometrical form of a single defect, such as a relief step or other structure, can be sufficient to determined the orientation of a layer in a film. In such situations, other artificial defects may be present at the surface, but their adjacent is not the determinant in crystallographic orientation.

BRIEF DESCRIPTION OF THE DRAWING

FIG. 1 is a diagrammatic representation showing a substrate covered with a chromium thin film while practicing the process according to the invention;

FIG. 2 illustrates how a resist film over the thin film is exposed with radiant energy in practicing the invention;

FIG. 3 is a diagrammatic representation of the grating relief structure which remains in the resist following development in practicing the invention;

FIG. 4 illustrates etching through chromium in practicing the invention;

FIG. 5 illustrates the relief grating formed in a substrate following etching in practicing the invention;

FIG. 6 illustrates the structure with a thin film of silicon over the relief structure in practicing the invention;

FIG. 8 illustrates an embodiment of the invention having a relief step etched into the surface; and FIG. 9 illustrates an embodiment of the invention having relief structure including facets which intersect substantially at the intersection angles of the (111) planes in cubic crystals.

DETAILED DESCRIPTION OF PREFERRED EMBODIMENTS

Figure 7:
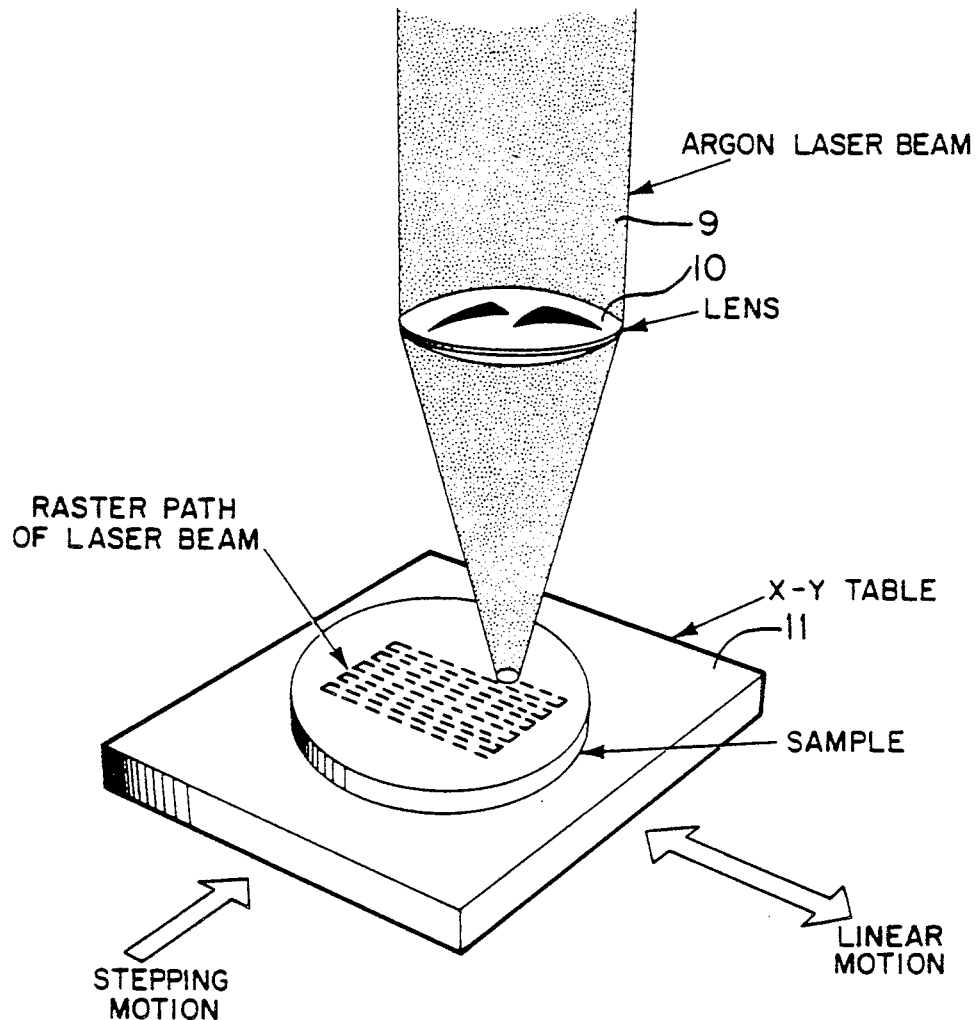
FIG. 7 is a pictorial representation of apparatus for laser capitalization in practicing the invention.

With reference now to the drawing, and more particularly FIGS. 1-9, there is illustrated a method of creating a relief structure on the surface of an amorphous solid fused silica, $SiO_2$, substrate and thereafter producing thereon an epitaxial or preferred orientation layer of silicon. The fused silica, $SiO_2$, substrate 1 is first covered with a thin film of evaporated or sputtered chromium 2 about 2 nm Z(200 Å) thick. This is then covered with about 5000 Å of photoresist 3 such as AZ 1350B (a product of the Shipley Company, Newton, Mass.) and exposed in a pattern by passing ultraviolet radiation 4 through a photomask 5 having a grating pattern 6. Alternatively, holographic lithography could be used to expose a grating in the photoresist, and, in place of AZ 1350B, another radiation sensitive polymer film could be substituted and the exposure of a pattern could be done by means of X-ray lithography (as described in the aforesaid copending patent application Enhancing Epitaxy and Preferred Orientation) electron beam lithography, ion beam lithography or other means. Although the mask 5 in FIG. 2 is shown out of contact with the resist film 3, in practice intimate contact is preferred in order to ensure a faithful replication of the mask pattern. In one series of experiments reported in the article by M. W. Geis, D. C. Flanders and H. I. Smith cited above, the spatial period of the grating pattern 6 was 3.8 μm.

After exposure of the resist 3, a development step removed the exposed regions, leaving a grating relief structure in resist 3 on top of the chromium 2, as illustrated in FIG. 3. The chromium was then etched in an aqueous chemical etchant (a mixture of 164.5 grams of Ceric ammonium nitrate, 43 milliliters of concentrated perchloric acid (70%) with water added to make 1 liter) and the resist dissolved in a solvent or removed in an oxygen plasma or ozone. The $SiO_2$ substrate, masked by the chromium grating, 2 in FIG. 4, was then etched to a depth of about 1000 Å using a reactive ion etching process (see article by D. C. Flanders and H. I. Smith, "Surface Relief Structures With Linewidths Below 2000 Å", Applied Physics Letters, Vol. 32, pp. 112-114, 15 Jan. 1978), thereby yielding a relief grating, 7, in the $SiO_2$ as shown in FIG. 5. Following this, the chromium was removed using the same chemical etchant formulation cited above.

Next, a thin film of silicon, 8 in FIG. 6, about 5000 Å thick, was deposited over the relief structure 7 in the $SiO_2$ by a chemical vapor deposition process in a commercial system designed for such silicon deposition. The temperature of deposition was 610° C. sop as to yield an amorphous film of silicon. Following this, as illustrated in FIG. 7, an argon laser beam, 9, was focused onto the silicon film, using lens 10, and the substrate was scanned, in a raster fashion, past the beam, using a simple mechanical scanning platform 11. This process has been called "laser annealing" or "Laser crystallization" and is well-known in the modern art (see, for example, U.S. Pat. No. 4,059,461 by J. C. C. Fan and Herbert J. Zeiger, "Method for Improving the Crystallinity of Semiconductor Films by Laser Beam Scanning and the Products Thereof"). At an appropriate power density, which appears to be around the region of melting, the amorphous silicon converts, upon cooling, to a polycrystalline form. On smooth amorphous fused silica substrates, this polycrystalline silicon was found to have a substantially (100) texture (that is, (100) planes of the individual crystallites tend to be parallel to the fused silica substrate) if the laser crystallization was done in air. When the laser crystallization was done in air over that region of the substrate containing a grating relief structure, 7, the silicon became oriented by the relief structure. The degree of completeness of the orientation was increased with additional raster scans of the substrate under the laser beam. The <100> crystallographic directions of this silicon (that had been laser crystallized inside the grating area) were substantially parallel and perpendicular to the grating and perpendicular to the plane of the $SiO_2$ surface. In areas outside the grating, many discrete silicon crystallites were observed. These tended to have one of their three <100> directions perpendicular to the $SiO_2$ surface and the other two randomly directed in the plane of the surface. Thus, a substantially epitaxial film was obtained only over the surface relief structure, indicating that crystallographic orientation was determined, controlled or influenced by the artificial defects, and that the energy input from the laser induced or enhanced the orienting influence. The above results demonstrate the principle of the invention.

Under certain circumstances, the orienting influence of artificial defects may not depend on the adjacency of other defects. Instead, the geometric arrangement (that is, the position, orientation and geometric form) of a single defect can be sufficient to induce crystallographic orientation. For example, consider the situation depicted in FIG. 8. A substrate 12, has a relief step 13 etched into its surface. The substrate is covered with an amorphous or polycrystalline film 14, and an incident beam 15 of electrons, ions, electromagnetic radiation or other form of energy input is scanned over the film, past the relief step, 13. As a result of energy input from the beam 15, crystallization is nucleated at the relief step 13, and the crystal or crystals thus formed are oriented in accordance with the geometric form of the relief step. These crystals can then act as seeds from which further oriented crystal growth can be extended over large distances. Such extension of the crystal growth can be induced, for example, by additional scanning of the beam 15, by scanning with other beams, or by annealing at elevated temperature.

As a specific example, consider the case of a smooth amorphous substrate, such as thermally grown $SiO_2$, over a silicon wafer on top of which a 0.5 μm thick film of amorphous silicon has been deposited by a CVD process. If when such a film is heated to a suitable high temperature by scanning lit under an argon ion laser beam (using an apparatus such as shown in FIG. 7), the amorphous silicon crystallizes with a (111) texture (that is, a multiplicity of crystals form which have (111) planes parallel to the substrate surface, but random orientation in the plane of the substrate). As can be seen the argon ion laser energy beam impinges upon an area of the film that is small compared to the total area of the film, and this impingement area and the film are relatively displaced as indicated to scan the layer with the impingement area. If instead of a smooth surface, a relief step is etched into the surface, such as depicted as 13 in FIG. 8, and further if the angle of intersection of the facets of the relief step is 70.5° (corresponding to the angle of intersection of (111) planes in a cubic crystal-silicon being a cubic crystal), then the crystal nucleation that takes place at the relief step, when the substrate is passed under the laser beam, will have one of tis (111) directions oriented predominantly perpendicular to the plane of the inclined facet in FIG. 8. The crystal or crystals, oriented by the single relief step, can then serve as the starting point for more extensive crystallization, which would have orientation determined by the orientation of the crystal or crystals formed initially at the relief step 13.

Another specific improvement on the invention of the aforesaid U.S. Pat. No. 4,333,792 granted Jun. 8, 1982, which is a continuation-in-part of abandoned application ("Enhancing Epitaxy and Preferred Orientation", Ser. No. 756,358) is depicted in FIG. 9. The relief structure includes facets which intersect at 70.5° and 109.5°with the horizontal, corresponding to the intersection angles of the (111) planes in cubic crystals. Such a relief structure would be preferred for obtaining epitaxial or preferred orientation films having (111) planes parallel to the substrate surface plane.

There has been described novel structure and techniques representing an improvement in graphoepitaxy. It is evident that those skilled in the art may now make numerous uses and modifications of and departures from the specific techniques and structure disclosed herein without departing from the invention concepts.

Consequently, the invention is to be construed as embracing each and every novel feature and novel combination of features present in or possessed by the apparatus and techniques herein disclosed and limited solely by the spirit and scope of the appended claims.

What is claimed is:

1. In a method enhancing epitaxy and preferred orientation which method includes the steps of intentionally forming at predetermined locations a plurality of artificial defects having predetermined geometric form at the surface of a solid substrate and thereafter depositing a film on said surface to form a substantially epitaxial or preferred orientation layer in said film having crystallographic orientation influenced by the geometry of an artificial defect so that said predetermined form influences the crystallographic orientation in said film on said surface, the improvement which resides in enhancing the orienting influence of said artificial defects in solid state transformation by applying an incident beam of energy to said film in air at an impingement area that is much smaller than the total area of said film and relatively displacing said film and said impingement area to scan said film with said energy beam over an area of said film much larger than said impingement area, and further including the step of forming artificial steps among said artificial defects having sloping walls parallel to one another and inclined at an angle selected from the group consisting of substantially 70.5° and 109.5° relative to the horizontal.

2. In a method of enhancing epitaxy and preferred orientation which method includes the steps of intentionally forming at predetermined locations a plurality of artificial defects having predetermined geometric form at the surface of a solid substrate and thereafter depositing a film on said surface to form a substantially epitaxial or preferred orientation layer in said film having crystallographic orientation influenced by the geometry of an artificial defect so that said predetermined form influences the crystallographic orientation in said film on said surface, the improvement wherein said energy beam is a laser beam and said step of relatively displacing includes relatively displacing said laser beam and said film in first and second mutually orthogonal directions to define a raster path of said impinging area upon said film, and further including the step of forming artificial steps among said artificial defects having sloping walls parallel to one another and inclined at an angle selected from the group consisting of substantially 70.5° and 109.5° relative to the horizontal.

* * * * *

UNITED STATES PATENT AND TRADEMARK OFFICE
CERTIFICATE OF CORRECTION

PATENT NO. : 5,122,223
DATED : June 16, 1992
INVENTOR(S) : Michael W. Geis, Dale C. Flanders, Henry I. Smith It is certified that error appears in the above-indentified patent and that said Letters Patent is hereby corrected as shown below:

Col. 1, line 14 after "in" insert --U.S. Patent No. 4,333,792 granted June 8, 1992, which is a continuation-in-part of--.

Col. 2, line 8; "determined" should be --determine--.

Col. 2, line 16; "cent" should be --cency--.

Col. 2, line 37; "capitalization" should be --crystallization--.

Col. 2, line 54; "2 nm" should be --20 nm--.

Col. 3, line 28; "sop" should be --so--.

Col. 4, line 54; "abandoned" should be --co-pending--.

Signed and Sealed this

Twenty-sixth Day of October, 1993

Attest:

BRUCE LEHMAN

Attesting Officer     Commissioner of Patents and Trademarks